United States Patent [19]
Blake et al.

[11] Patent Number: 5,297,091
[45] Date of Patent: Mar. 22, 1994

[54] EARLY ROW ADDRESS STROBE (RAS) PRECHARGE

[75] Inventors: Robert M. Blake, Wappingers Falls, N.Y.; William P. Hovis, Rochester, Minn.; David J. Perlman, Wappingers Falls, N.Y.

[73] Assignee: International Business Machines Corporation, Armonk, N.Y.

[21] Appl. No.: 786,241

[22] Filed: Oct. 31, 1991

[51] Int. Cl.$^5$ ............................................. G11C 7/00
[52] U.S. Cl. ............................ 365/203; 365/189.01; 365/189.12
[58] Field of Search ............ 365/203, 189.01, 189.12, 365/239, 240, 233

[56] References Cited
U.S. PATENT DOCUMENTS

| | | |
|---|---|---|
| 4,330,852 | 5/1982 | Redwine et al. .................... 365/240 |
| 4,796,231 | 1/1989 | Pinkham .......................... 365/189.12 |
| 4,914,630 | 4/1990 | Fujishima et al. ............. 365/189.12 |
| 4,987,559 | 1/1991 | Miyauchi et al. ................... 365/240 |
| 5,042,007 | 8/1991 | D'Luna ........................... 365/189.12 |

*Primary Examiner*—Eugene R. LaRoche
*Assistant Examiner*—Son Dinh
*Attorney, Agent, or Firm*—Irwin Ostroff

[57] ABSTRACT

In a memory system, which includes a dynamic random access memory (DRAM) that has to be precharged before the contents thereof can be selectively read out into a static register, there is provided means for reading the memory contents of the memory cells of a part or the whole of a row of memory cells of the DRAM into the static register while concurrently precharging the DRAM for a subsequent read-out command. This reduces the overall cycle time of the memory array since read-out of the static register can occur during precharge.

13 Claims, 8 Drawing Sheets

EARLY ROW ADDRESS STROBE (RAS) PRECHARGE

FIELD OF THE INVENTION

This invention relates to a memory system and, in particular, to a memory system in which the read cycle time is reduced.

BACKGROUND OF THE INVENTION

In memory systems, including those utilizing dynamic random access memory (DRAM) arrays, it is known to use a static register to store a part or the whole of the contents of a word line of the memory array. This enables the data bits in the static register to be selectively coupled via an output buffer for further processing after the data bits have been read out of the memory.

Referring now to FIG. 1, there is shown a prior art memory system 2 comprising a memory array and control circuitry 26 (shown within a dashed rectangle), a RE Phases Generator 10, a CE phases Generator 12, a static register and data 1/0 control 14, address buffers 16, address transition detector 18, address latches and register predecoders 20, static register and decoder 22, and a data I/O and multiplexer 24. Memory array and control circuitry 26 comprises row address latches and predecoder control 28, column address latches and predecoder control 30, row decoder 32, column decoder 36 and memory array and sense amplifiers 34.

In the operation of the system 2 of FIG. 1, the data bits contained in the static register 22 must be transferred out of the register before the next row (not shown) of the memory array 34 to-be-read can be precharged. This presents a problem since for continued read-out of the static register 22, a signal [RAS or RE] enabling the memory array 34 must remain in the enabling condition until the last location is read out of the static register 22. This means that the cycle time to read each row must include the time to actually read out the contents of a row (TR) as well as the time to precharge that row (TP).

In the operation of the system 2 of FIG. 1, a user generated read enable (RE) signal also referred to herein as RAS is coupled to a terminal 301 which is connected to an input (denoted by the letter "a") of RE phases generator 10. RE phases generator 10 functions to detect a read enable (RE) signal condition. For purpose of illustration herein, the read enable (RE) condition occurs when an RE or Row Address Strobe (RAS) signal goes from a high level or logic "1" to a low level or logic "0". Also, in the discussion to follow, the terms RE and RAS are used interchangeably.

In response to a RE enable condition, generator 10 then generates two output signals, FAST RASIN (FRASIN) at an output b and RASIN at an output c for use within the memory system. The FRASIN signal at output "b" is coupled to the address buffers 16, CE Phases generator 12 and static register and data I/O control 14. The RASIN signal at output "c" is coupled to the row and column address latch predecoders control 28 and 30 and to the static register and data I/O control 14.

The structure and function performed by Generator 10 may be better understood by reference to the more detailed showing of FIG. 2.

Referring now to FIG. 2, there is shown a prior art embodiment of the generator 10 of FIG. 1 which comprises a RASIN BUFFER 303 and a FAST RASIN buffer 305. A user generated read enable (RE or RAS) signal is applied to an input terminal 301 and is shown in waveform "a" of FIG. 3. The FAST RASIN BUFFER 305 has an input (IN) connected to node "a" which is connected to terminal 301 and an output "b" at which is produced an output signal denoted as FAST RASIN or FRASIN and shown in waveform "b" of FIG. 3. RASIN BUFFER 303 has an input (IN1) connected to node "a" and another input, IN2, which is coupled to the output "b" of FAST RASIN BUFFER 305. The RASIN BUFFER 303 has an output "c" at which is produced an output signal denoted as RASIN and shown in waveform "c" of FIG. 3. The FRASIN signal is coupled via line 11b to the CE Phases Generator 12, to address buffers 16 and to static register and data I/O control 14 as shown in FIG. 1. The RASIN signal is coupled via line 11a to row and column address latches and predecoder control 28 and 30 and to the static register and data I/O control 14 as is shown in FIG. 1.

Referring now to FIG. 3, note that the RAS signal goes low at time t0. In response thereto and a short time delay thereafter, the FRASIN signal goes low at time t1. Then, in response to RAS being low and FRASIN going low, the RASIN signal goes low at time t2, a short time delay after FRASIN goes low. However, note that after RAS goes high at time t3, both FRASIN and RASIN terminate (i.e., go high or logic "1") at the same time(i.e., t4). The reason for delaying RASIN going low relative to FRASIN going low is to ensure that the FRASIN signal enables the outputs of address buffers 16 and causes them to be valid prior to RASIN enabling the selection of the appropriate row of the memory array 34.

For a better understanding of the explanation to follow, a brief description of parts of the memory system 2 of FIG. 1 is set forth below.

(A) CE phases generator 12 detects changes in a column enable (CE) or column address strobe (CAS) signal and produces a CASIN signal for internal use. The CRASIN signal functions to activate the bit decode circuitry (i.e. blocks 30 and 20) associated with the array 26 and the static register 22 and provides an enabling control signal to the static register and data I/O control 14.

(B) Static Register and Data I/O Control 14 functions to provide read and write commands to or from the static register 22 and the DATA I/O 24.

(C) Address Buffers 16, which has inputs A0 through A11, generates internal address information used for both row and column selection. The FRASIN output of generator 10 is coupled to BUFFERS 16 which are turned on and off by the FRASIN signal.

(D) Address Transition Detector 18 produces new read or write accesses (enabling signals) from or to the static register control 14 which then supplies control signals to static register 22 and DATA I/O 24 when an address transition (or change) is detected for a static column mode component. Any address change during a read cycle initiates a valid read access (enable) which is completed if no further address changes are detected.

(E) Address Latches Register Predecoders 20—The address latches only operate for PAGE mode components and simply pass address buffer information to the predecoders for static column mode operation. PAGE mode operation captures address information when CAS (or CE) become active (low).

(F) Static Register and Decoder 22—Contains data line information read out from the array 34 for every read enable and column enable signal. Every read from the memory comes through the static register 22 which is loaded from the memory array once with every RE and CE access. When the RE signal returns to the precharge or standby condition, the contents of the static register are written back into the memory array. During write cycles, data bits are changed within the static register which then update the memory array when RE goes from the enable (low) to the disable (high) condition. The decoder 22 decodes the remaining column enable (CE) address decodes which were not used in the array and determine which register bit is to be written or read.

(G) Data I/O and Multiplexer 24—Is a block of logic which controls which of two data bits is to be read or written. Also, a latch (in block 24) holds the last bit read from the register 22 until the next valid read cycle. The static register and data I/O control 14 determines whether the Data I/O 24 and register 22 receives data from or supplies data to the memory system.

(H) Memory array 26 includes a matrix array 34 of dynamic random access memory (DRAM) cells and sense amplifiers which store information for future use. Array 26 also includes row address latches predecoder control 28 which is enabled by RASIN and with row decoder 32 controls which row of array 34 is selected for read-out. Array 26 also includes column address latches predecoder control 30 which is enabled by RASIN and CASIN signals and which produces outputs applied to column decoder 36 which function to decode the bit lines and thus selects which bit lines gets coupled to the data lines and fed into (or out of) the Static Register 22.

In the operation of the memory system 2 of FIGS. 1 and 2, the read cycle of a DRAM is initiated by the application of a RAS [ROW ENABLE—RE-] signal which goes from a precharge or standby condition (e.g., high or logic "1") to an enable condition (e.g., low or logic "0"). The RAS signal is used to generate a FRASIN signal which is applied to, and enables, the CE phases generator 12, static generator control 14 and address buffers 16. The RAS signal is also used to generate a RASIN signal which enables the contents of a word line of the memory array to be read out onto the bit lines (columns). The data on the bit lines are amplified by sense amplifiers coupled to the bit lines for generation of better defined signals which are either close to ground potential or to the voltage level of a power supply (e.g., Vdd) used with the memory array and sense amplifiers 34. The information on selected bit lines are then decoded onto data lines which are coupled to static register 22 from which the data bits can be selectively read out via DATA I/O 24 to other utilization circuits. However, when the RAS signal goes from the enable condition to the precharge condition, CE phases generator 12, static register control 14 and address buffers 16 are disabled and the data stored in static register 22 can no longer be read-out. Thus, in the memory system 2 of FIG. 1, the RAS signal must be maintained in its enable condition and a new row of the memory array can not be precharged so long as the contents of static register 22 have to be read-out. This effectively increases read cycle time and thus the total cycle time of the memory system 2.

It is desirable to have a memory system which has improved read cycle time as compared to memory system 2.

SUMMARY OF THE INVENTION

The present invention resides, in part, in the recognition that the read-out of the contents of a row of a memory array onto the bit lines and into a static register can be done very quickly during a time period which is arbitrarily defined as "TR", where TR is a small portion of the prior art read enable period. Accordingly, in circuits embodying the invention, the static register and the memory array are controlled by two logically separate and distinct signals. One signal (e.g. RASIN) applied to the memory array enables read-out from the memory array after receipt of a read (RAS) command for a preset read enable period, TR. After TR, the memory enable (RASIN) signal causes the memory array to return to a precharge condition to prepare the memory for the next word line to be read-out. The other signal (e.g., FAST RASIN) enables the operation of the static register after the receipt of a read command and maintains the static register in the enabling condition beyond the TR period. Thus, in contrast to the prior art, in systems embodying the invention, the termination of the memory enable (e.g. when RASIN goes from low to high) condition does not disable read-out from the static register and associated buffers, respectively, storing and processing the data bits just read-out of the row. This permits the information read out of the previously read word line to be propagated from the static register via the output buffers for further processing even though the memory array is no longer enabled. Thus, while the contents of one word line are being processed, another word line of the memory array can be precharged and prepared for read-out. Hence, in circuits embodying the invention, the read-out cycle time is significantly reduced.

Viewed from another aspect, the present invention is directed to a memory system. The memory system includes a memory array whose contents are selectively read out to a register and comprises means coupled to and within said register for receiving and statically storing a predetermined number of data bits read out from said memory array; and enabling means coupled to said register and to said memory array for enabling the read-out of the contents of said register and for concurrently precharging the memory array to prepare it for a subsequent read-out command.

Viewed from still another aspect, the present invention is directed to a combination comprising a memory array of data storage elements, a static register, and means responsive to a read-out command. The static register statically stores selected bits read-out from the memory array into the static register. The means responsive to a read-out command is coupled to the memory array and to the static register and does the following: a) enables the memory array and the read-out of selected data from the memory array into the static register for a time period which begins shortly after receipt of the read-out command at a time t0 and extends for a time TR thereafter; b) resets the memory array after the time TR, and prepares it for the next read-out command during a time TP; and c) enables the contents of the static register to be read-out for a period beginning shortly after receipt of the read-out command and extending for a time which is longer than TR.

The invention will be better understood from the following more detailed description taken with the accompanying claims.

BRIEF DESCRIPTION OF THE DRAWING

In the accompanying FIGS. like reference characters denote like components; and

DETAILED DESCRIPTION

Figure 4:
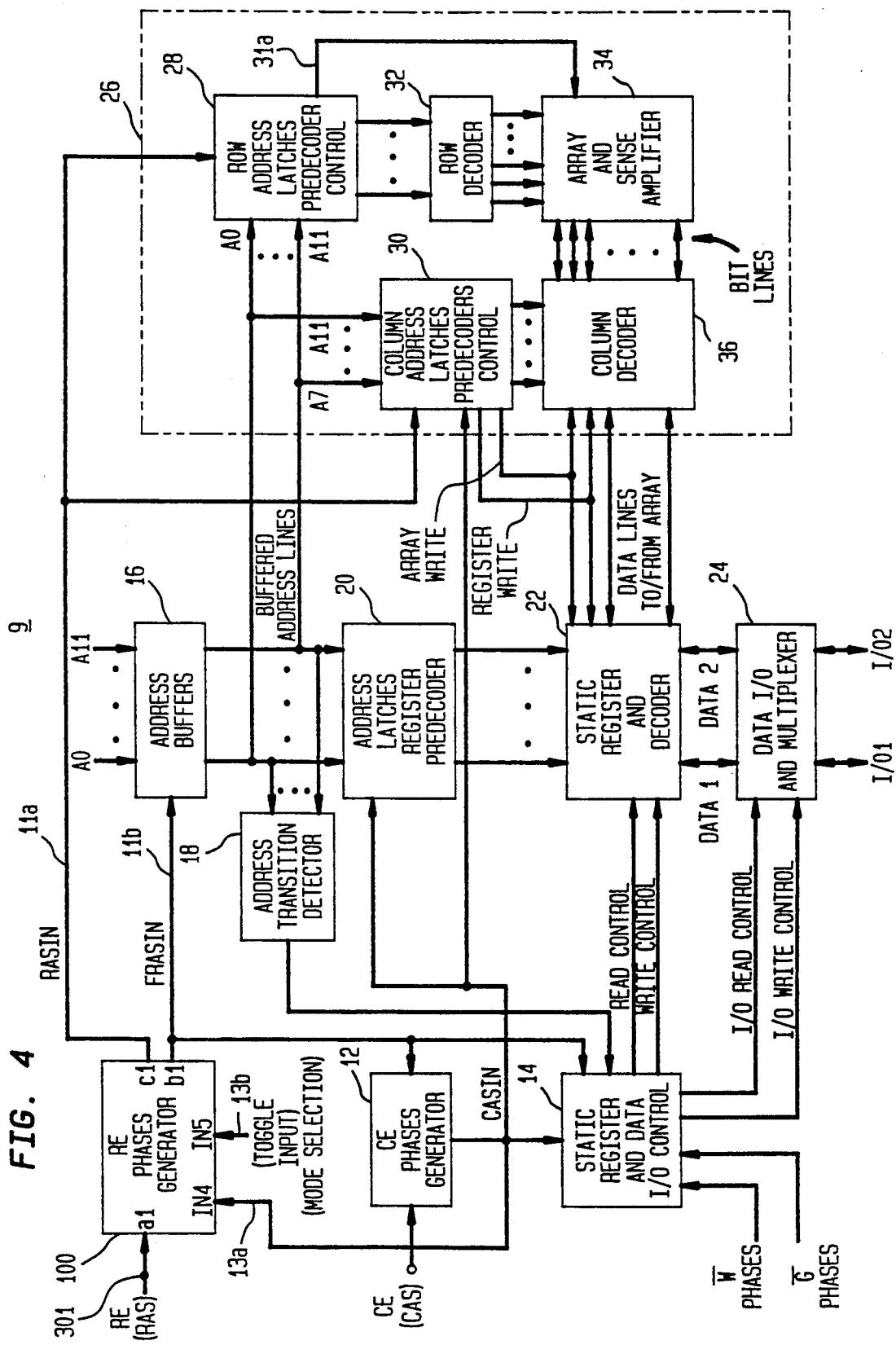
FIG. 4 is a block diagram of a memory system in accordance with the present invention.

Referring now to FIG. 4, there is shown a memory system 9 in accordance with the present invention. The memory system 9 differs from the memory system 2 of FIG. 1 primarily in that it includes a RE phases generator 100 which is different than the RE phases generator 10 of FIG. 1 and produces different control and timing signals.

The RE phases generator 100 has the following three input signals: a) RE or RAS; b) CASIN; and c) TOGGLE INPUT (MODE SELECTION). In addition, as discussed below, the RE phases generator 100 differs from the prior art generator 10 of FIG. 1 in the means for generating RASIN and FRASIN signals and in the characteristics of these two signals. To better understand the invention and the operation of the RE phases generator 100, reference will first be made to FIGS. 5 and 6.

Figure 1:
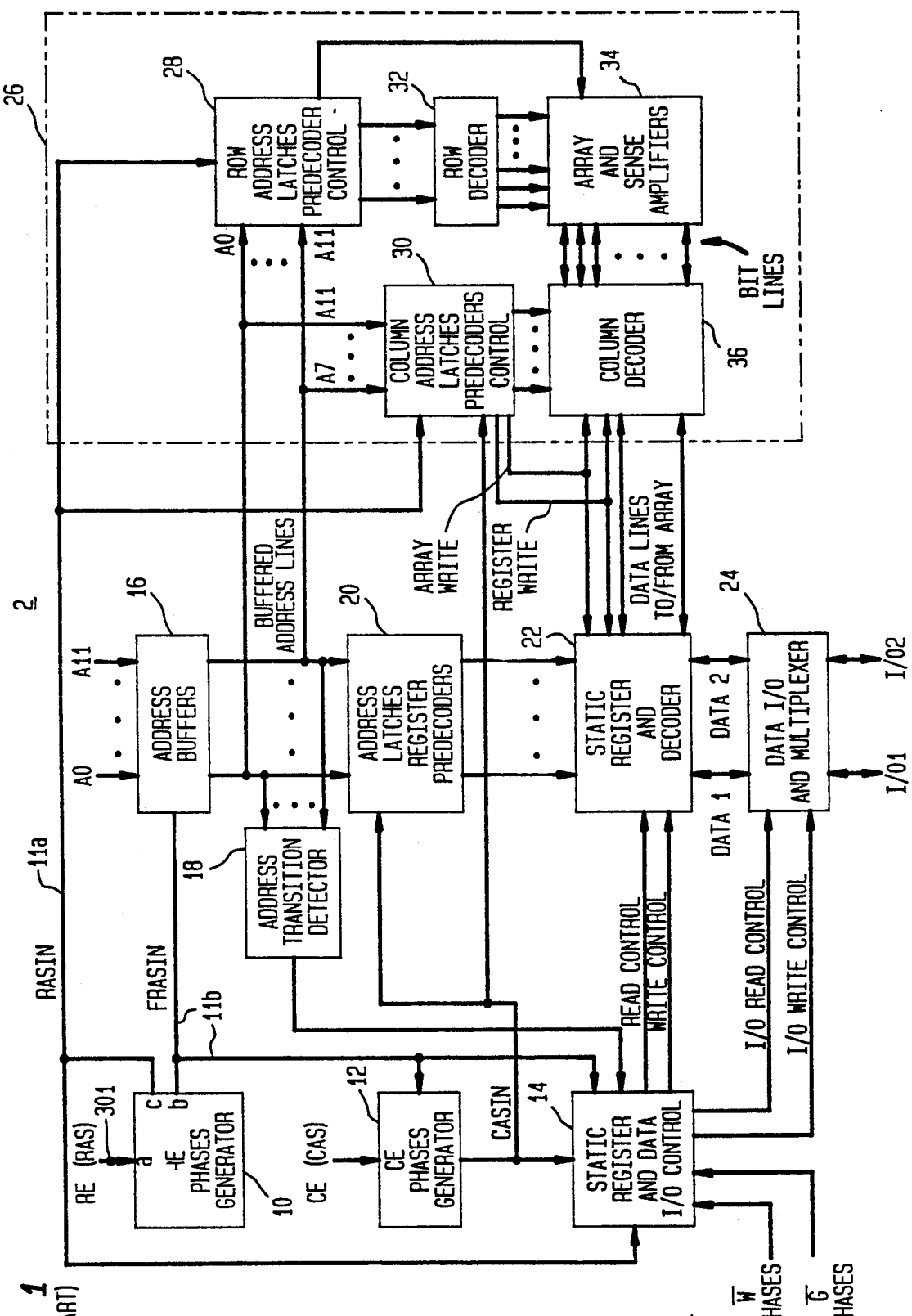
FIG. 1 shows a block diagram of a prior art memory system for reading the contents of a memory array.
Figure 5:
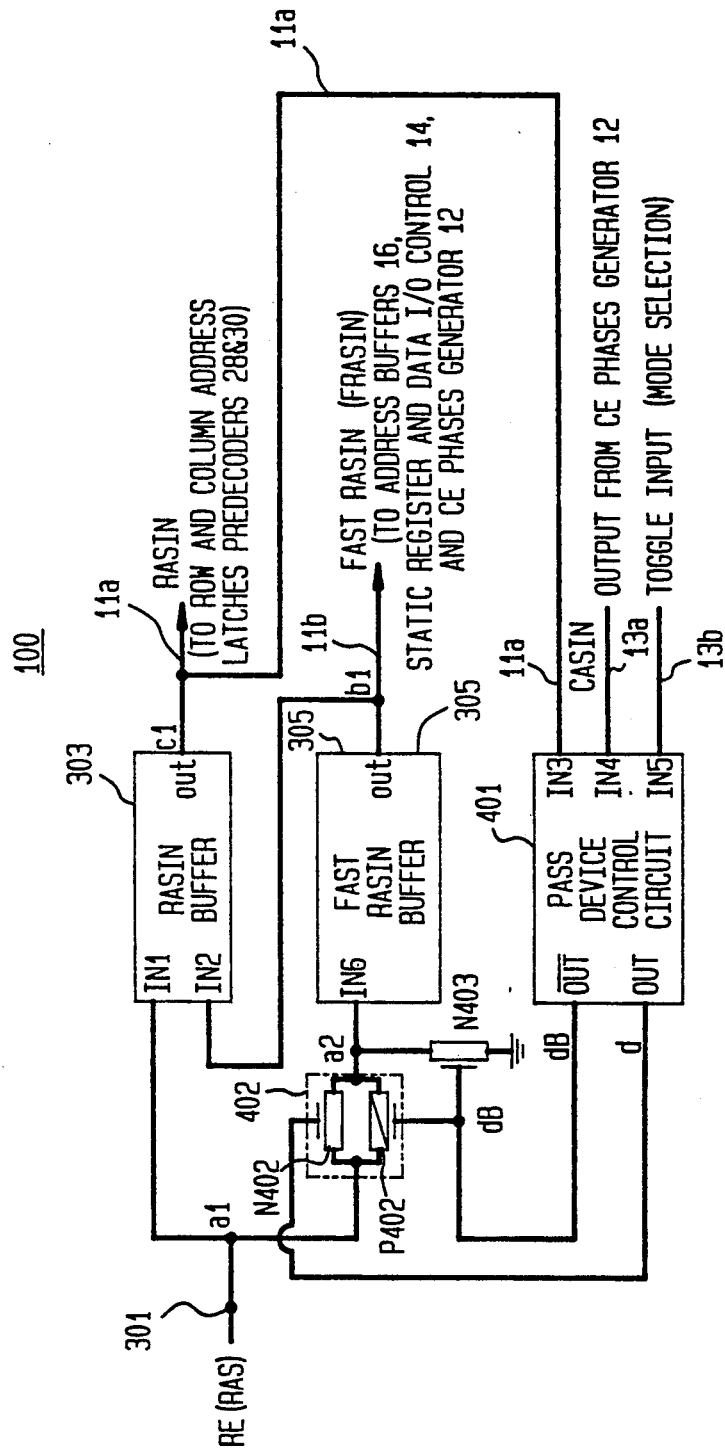
FIG. 5 is a semi-block, semi-schematic diagram of a generator 100 of FIG. 4.

FIG. 5 shows the major components of the RE phases generator 100 of FIG. 4 which are pertinent to the invention and illustrates how the RE PHASES generator 100 differs from the prior art RE phases generator 10 of FIG. 1. The RE phases generator 100 comprises a RASIN buffer 303, a FAST RASIN buffer 305, a Pass Device Control circuit 401, and Insulated Gate Field Effect Transistors (IGFETs) N403, N402 and P402. The prefix N indicates the IGFET is of N-type conductivity and the prefix P indicates the IGFET is of P-type conductivity. IGFETs N402 and P402 form a transmission gate 402 (shown within a dashed line rectangle). The conduction paths of N402 and P402 are connected in parallel between terminal 301 and a node "a2" connected to the input IN6 of BUFFER 305. The conduction path of N403 is connected between node a2 and a reference potential which is shown as ground.

FAST RASIN BUFFER 305 has an input IN6 which is connected to node a2 and an output b1 at which is produced a FAST RASIN (FRASIN) output signal. The output b1 of BUFFER 305 is coupled to an input, IN2, of BUFFER 303 and to the address buffers 16, static register and data I/O Control 14 and CE phases generator 12. RASIN BUFFER 303 has an input, IN1, which is connected to node a1 and terminal 301, and another input, IN2, which is connected to the output "b1" of FAST RASIN BUFFER 305. RASIN buffer 303 has an output c1 at which is produced a RASIN signal which is coupled via line 11a to the row and column address latches predecoders 28 and 30 of FIG. 4 and to an input, IN3, of pass device control circuit 401.

Pass device control circuit 401 which controls the conductivity of N402, P402 and N403 has three inputs. As already noted, the RASIN signal is applied to input IN3. The output signal CASIN from CE phases generator 12 (see FIG. 4) is applied via a line 13a to input IN4 of circuit 401. A user generated TOGGLE INPUT signal (Mode Selection) is applied to input IN5 of circuit 401 via a line 13b. The TOGGLE INPUT signal is derived by prefixed or customer supplied conditions which determine the mode of operation. Pass Device Control Circuit 401 produces two complementary output signals, d and dB, in response to the three input signals (RASIN, CASIN, TOGGLE INPUT) applied to its three inputs (IN3, IN4, IN5). The "d" output is applied to the gate electrode of N402 and the dB output is applied to the gates of P402 and N403.

Figure 6:
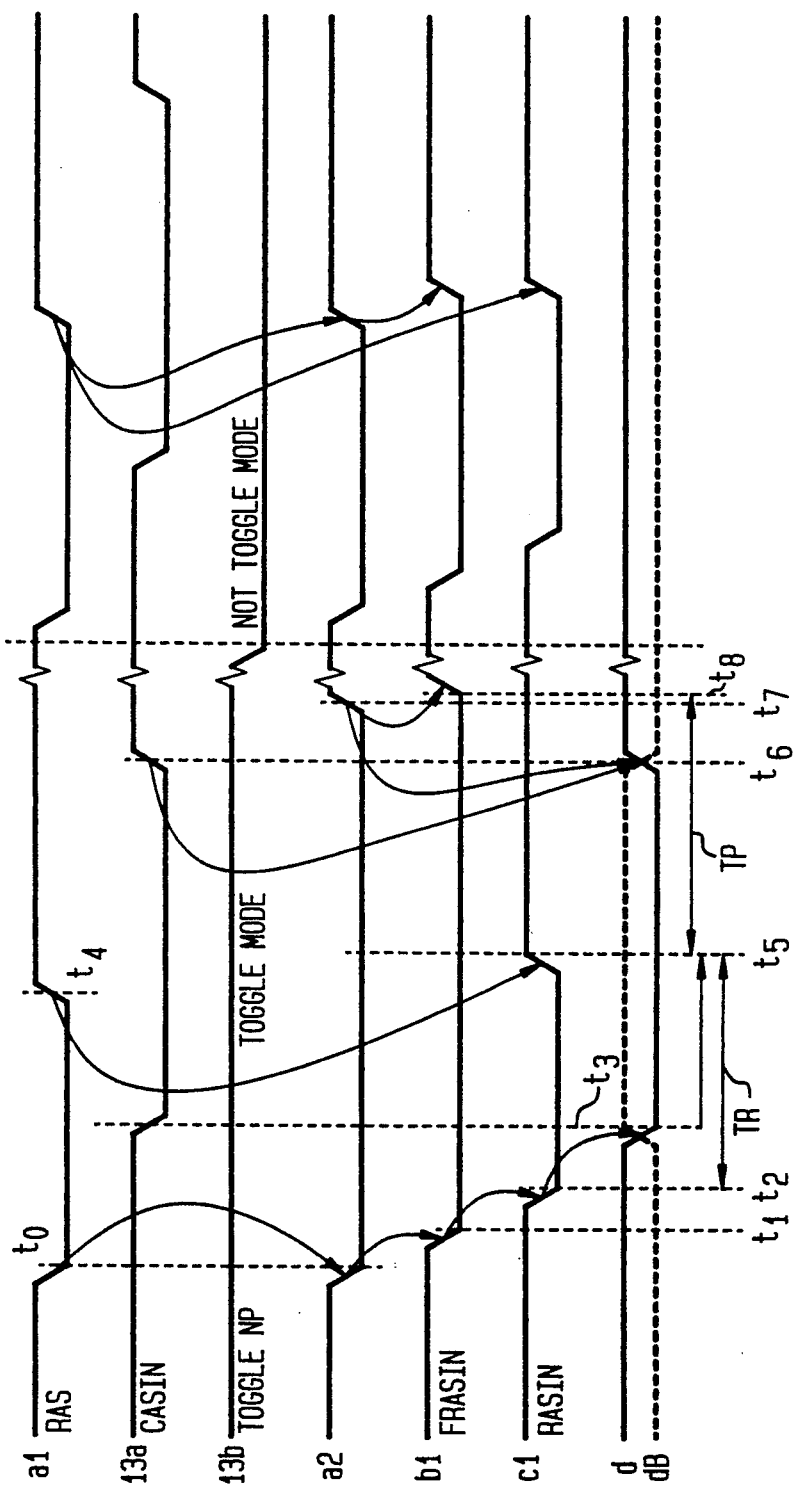
FIG. 6 is a diagram of electrical waveforms associated with the generator 100 of FIG. 5.

The signals generated at nodes a1, a2, b1, c1, d, dB and on lines 13a and 13b are respectively identified by like numbered waveforms in FIG. 6.

When the RASIN signal is in the enable state (i.e., low or logic "0") as shown from time t2 to t4 for c1 of FIG. 6, it enables the row and column address latches 28 and 30 which in turn enables the read-out of a row of memory cells in memory array and sense amplifiers 34. When the RASIN signal returns to a high state, a "1", it causes the memory array to be placed in the precharge or standby condition.

IGFETs N402 and P402 are turned on at the same time and turned off at the same time by means of signals "d" and dB applied to their gate electrodes. The conduction path of IGFET N403 is connected between the input of Buffer 305 and ground and dB is applied to its gate whereby it functions to clamp the input of buffer 305 to ground when dB is high. That is, when the transmission gate 402 is disabled, N403 clamps the input of buffer 305 to ground.

The operation of the RE phase generator circuit 100 of FIGS. 4 and 5 is best explained with reference to the waveform diagrams of FIG. 6. When the RAS signal goes to an enable condition, (i.e., low or logic "0") at time t0, the low RAS signal is coupled via transmission gate T402 to the input a2 of FAST RASIN buffer 305 causing a2 to go low at time t0. In response thereto, the FAST RASIN (FRASIN) signal at the output of BUFFER 305 goes low at time t1 as shown for b1 of FIG. 6. The low FRASIN signal (waveform b1) then enables address buffers 16, CE phases generator 12 and static register control 14.

The application of a low RAS signal at time t0 and a low FRASIN signal at time t1 to the two inputs of the buffer 303 causes the RASIN signal at the output of the buffer 303 to go low at time t2 as shown for waveform c1 in FIG. 6. The low RASIN signal applied to the control circuits 28 and 30 of the memory array 34 enables the read-out of the contents of a row of the memory array onto the bit lines of the array. Following the RAS signal going high at time t4, the RASIN enable condition terminates at time t5, at which time the memory array 34 is placed in the precharge or standby condition.

However, beginning at time t3, the CASIN signal is applied to the control circuit 401 causing dB to be high and maintaining the input and output of FAST RASIN buffer 305 in the low (enable) condition. So long as FRASIN is in the enable condition, the address buffer 16, the CE phases generator 12 and the static control register 14 are enabled and the information present in the static register 22 can continue to be read out to DATA I/O 24.

The CASIN signal, when in the enable state, enables the information present on the bit lines to be selectively coupled onto the data lines and to the static register 22 and from register 22 to the Data I/O and Multiplexer 24. When the CASIN signal terminates (i.e., goes high) at time t6, the output of control circuit 401 changes so that d goes high and dB goes low, enabling transmission gate 402 and turning off N403. However, with RAS high, the signal applied to IN6 is high as shown for a2 at time t7. Then, with the RAS signal being high, the input of BUFFER 305 goes high at time t7 and its output goes high at time t8 (RASIN signal remains high) concluding a read-out cycle.

Note that when FRASIN goes high at time t8, as shown in FIG. 6, the RASIN signal has been high since t5 and the array 26 has been precharged and is ready for the next read-out cycle. The period of time between T=t5 and t=t8 is the precharge time TP.

Referring back to FIG. 4, the operation of the system during a read cycle will now be discussed.

1. Assume that at time t0, an enabling RAS signal (i.e., RAS goes low) is applied to terminal 301.
2. In response thereto, RE phases generator 100 produces an enabling FRASIN signal at a time t1, where t1 occurs a short time delay after t0, and an enabling RASIN signal at a time t2 where t2 is a brief time delay after t1. In this example as above, the signals are deemed enabling when they go low.
3. The enabling FRASIN signal is applied to the CE phases generator 12, static register and data I/O control 14 and address buffers 16. Except for the application of the CASIN output of the CE phases generator 12 to PHASES GENERATOR 100, the interconnections and responses of CE Phases Generator 12, static register and data I/O control 14 and buffers 16 are identical to those of the prior art. However, as discussed below, the feedback of CASIN to RE phases generator 100 provides a significantly different mode of operation than in the prior art.
4. In response to an enabling FRASIN and to an enabling CE signal, the CE phases generator 12 produces a CASIN signal which is applied via line 13a to RE phases generator 100, and which is also applied to static register and data I/O control 14, and to address latches register predecoder 20 and column address latches predecoder control 30.
5. In response to an enabling FRASIN signal and to Address Inputs A0–A11, the address buffers 16 produce an output which is applied to the address transition detectors 18, to address latches register predecoder 20, and to row and column address latches predecoder control 28 and 30. In turn, the address transition detector 18 provides an output which is coupled to static register and data I/O control 14 while the outputs of address latches register predecoder 20 are coupled to static register and decoder 22.
6. Static register and data I/O control 14 produces READ and WRITE CONTROL signals which are applied to static register and decoder 22. Static register and decoder 14 also produces I/O READ and WRITE CONTROL signals which are applied to data I/O and multiplexer 24.
7. Thus, in response to the FRASIN signal and the outputs of CE phases generator 12, static register and data I/O control 14 and address buffers 16, the address transition detector 18, address latches register predecoder 20 and the static register and decoder 22 are readied for a read operation.
8. The output of the static register and decoder 22 is coupled to the data I/O and multiplexer 24 which is controlled by the READ and WRITE CONTROL signals generated by static register and data I/O control 14. Concurrently, the RASIN signal applied to row address latches predecoder control 28 enables the output of control 28 which is applied to row decoder 32 whose outputs determine which row of memory cells of array and sense amplifiers 34 is read out onto the bit lines of the memory array of array and sense amplifiers 34. Concurrently, the output of column address latches predecoder control 30, in response to RASIN and CASIN signals, is applied to column decoder 36 for decoding the bit lines and coupling the desired signals onto the data lines. The signals on the data lines are coupled to the static register 22 which statically stores the data bits. The data stored in static register and decoder 22 are then read-out via data I/O and multiplexer 24 under the control of static register and data I/O control 14 and address latches register predecoder 20.
9. At a time t4, as shown in FIG. 6, the RAS signal returns to the disable condition. A short time delay later, at time t5 in FIG. 6, RASIN returns to the disable (precharge or standby) condition initiating the precharging of the memory array of array and sense amplifiers 34 and its preparation for the next read-out command. 10. However, beginning with time t2 and continuing until time t8, the FRASIN signal is in an enable state (as is the CASIN signal). As a result, static register and data I/O control 14 and the outputs of address latches register predecoder 20 continue to enable the read-out of static register 22 to DATA I/O 24. The read-out of static register and decoder 22 continues until time t8 when the FRASIN signal goes high terminating the read-out. Thus, during the time that the static register is being read-out, the memory array of array and sense amplifiers 34 is being placed in a condition where it can be read out immediately after FAST RASIN goes high. As a consequence and in so far as can be ascertained by an external user, there is minimal time taken for precharging the memory array.

Figure 7:
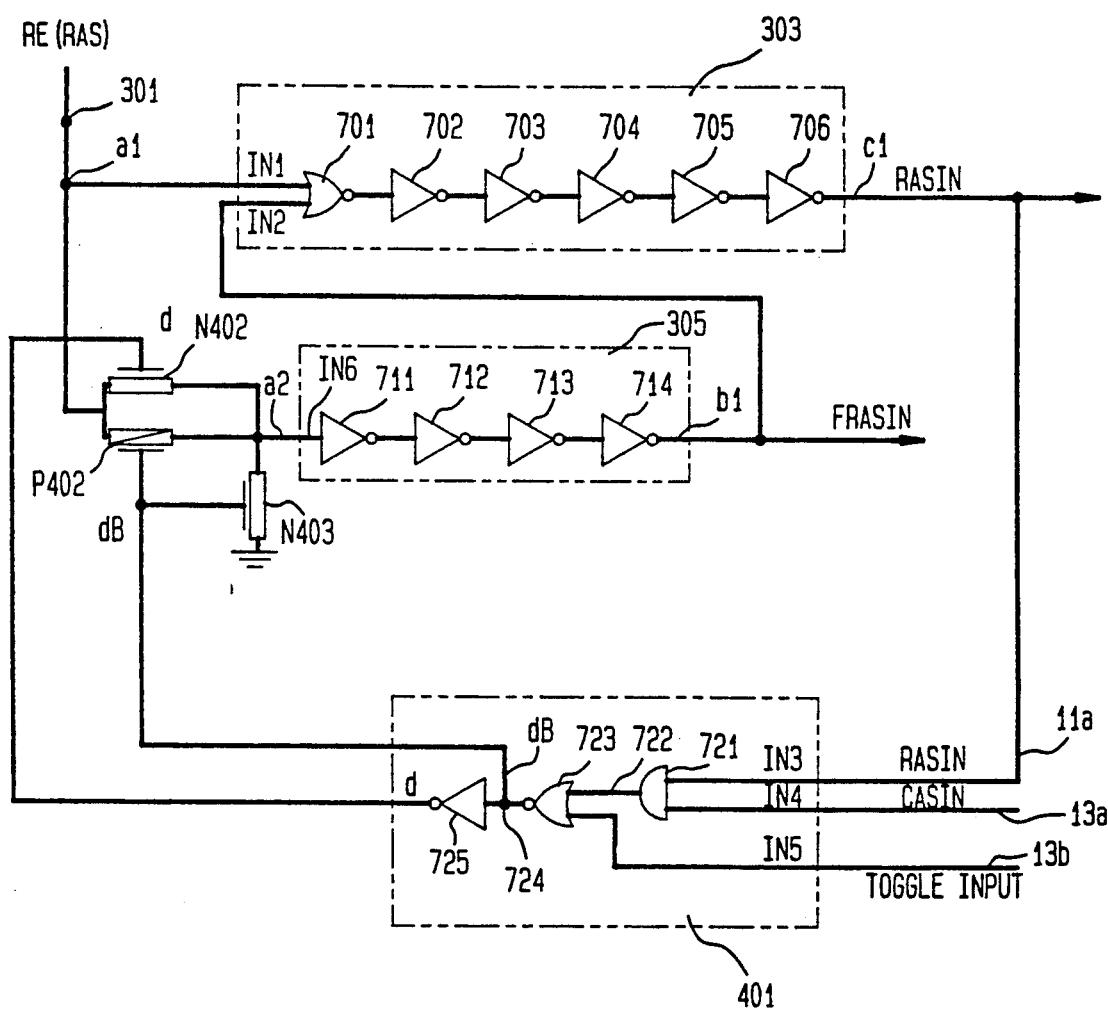
FIG. 7 is a simplified logic diagram of portions of the generator 100 of FIG. 5.

A simplified logic representation of circuitry included within RE Phase Generator 100 to implement the invention is detailed in FIG. 7.

RASIN BUFFER 303 includes a two input NOR gate 701 and five inverters 702, 703, 704, 705, 706 connected in cascade between the output of NOR gate 701 and the output c1 of BUFFER 303 at which is produced the RASIN signal. One input, IN1, of gate 701 is connected to input terminal a1 and another input, IN2, of gate 701 is connected to the output b1 of BUFFER 305.

FAST RASIN BUFFER 305 has an input IN6 connected to an input node a2 and includes 4 inverters (711, 712, 713 and 714) connected in cascade between its input IN6 and an output b1 of BUFFER 305 at which is produced the FAST RASIN (FRASIN) output signal.

Transistors N402 and P402 are pass devices which act as a transmission gate to either connect the RE input applied to terminals 301 and a1 to the input (a2 and IN6) of FAST RASIN BUFFER 305 or to isolate BUFFER 305 from the RE input. When N402 and P402 are selected to isolate RE from the input of BUFFER 305, transistor N403 is activated forcing node a2 to which the input IN6 of BUFFER 305 is connected to a "low" value irrespective of the true value of RE. The conductivity of N402, P402 and N403 is controlled by control circuit 401.

Control circuit 401 includes an AND gate 721 having two inputs, IN3 and IN4. The RASIN signal is applied to input IN3 which is connected via line 11a to c1. The CASIN signal produced by CE Phase generator 12 is applied to input IN4 which is connected via line 13a to CE Phase Generator 12 as shown in FIG. 4. The output 722 of AND gate 721 is connected to one input of a two input NOR gate 723. A TOGGLE INPUT signal is applied via line 13b to the other input of NOR gate 723. The state (high or low) of the TOGGLE INPUT signal is used to control the mode of operation of Phases generator 100 as detailed below. The output 724 of gate 723 at which is produced the output identified as dB (or d not) is connected to the input of an inverter 725 at whose output is produced the signal "d". The signal d, which is the complement of dB, is applied to the gate of N402 and the signal dB is applied to the gates of P402 and N403. As noted above, when d is high and dB is low, N402 and P402 are turned-on coupling node a1 to a2, and N403 is off. When d is low and dB is high, N402 and P402 are turned-off and N403 is turned-on coupling a2 to a low (logic "0" or ground) level.

For TOGGLE mode operation the TOGGLE INPUT signal is low. NOR gate 723 then functions as an inverter in response to the output signals of AND gate 721. When CASIN and RASIN are both high, the output 722 of AND gate 721 is high. This causes dB to be low and d to be high and transmission gate 402 is enabled coupling node a1 to node a2 while N403 is turned off. When either one or both of CASIN or RASIN goes low, the output of gate 722 goes low and the output of NOR gate goes high, whereby dB and d go high and low respectively. The condition of d-low and dB-high disables transmission gate 402 and applies a low level at the input of FAST RASIN BUFFER 305 causing the FRASIN output to remain low until both CASIN and RASIN go high.

For TOGGLE mode operation (i.e., the TOGGLE INPUT signal is low) the inputs RASIN and CASIN determine whether the pass devices (N402 and P402) and clamp device (N403) are on or off. When the memory system 9 is de-selected (RE and CE and hence RASIN and CASIN are all high), node dB is low and node d is high and nodes a1 and a2 are also high. When the memory system 9 is selected for a read (or a write) cycle, RE goes low, FAST RASIN goes low and RASIN goes low a little while later. RASIN going low causes the output of the AND gate 721 to go low which causes the output dB of the NOR gate 723 to go high and the output d of inverter 725 to go low. This condition of dB-high and d-low will cause the clamp device N403 to be on and apply a ground signal to node a2 which is connected to the input of IN6 of the FAST RASIN BUFFER. Thus, node a2 and input IN6 remain low and isolated from node a1 until both RASIN and CASIN return high. After RAS and RASIN go low, the selection cycle continues with CE (or CAS) going low and CASIN goes low. Following the time needed to read out the contents of part or a whole of a row of the memory array 34 into static register 22, RE goes high (after the minimum down time has been satisfied) and RASIN also goes high a short time later. CE and CASIN remain low and hence dB remains high and d remains low (See time t5 to t6 in FIG. 6). This causes FAST RASIN (FRASIN) to remain low and the circuitry associated with the read-out of the static register 22 to remain active (address buffers 16 and static register control 14, I/O driver 24, etc.). Once the desired read-outs from register 22 have been completed, the user/customer brings CE high. A short time later, CASIN goes high and then output dB goes low and output d goes high reconnecting node a2 to node a1 which causes node a2 to go from a low condition to the high condition a1. This in turn causes FAST RASIN to go high and the circuitry associated with reading the static register will be de-selected. This will put the memory system 9 in its standby state.

Figure 2:
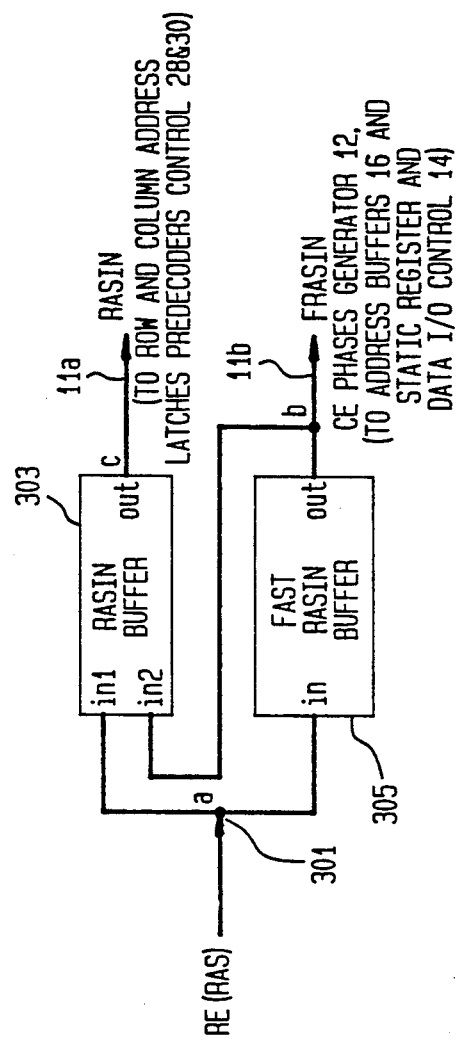
FIG. 2 shows a block diagram of the prior art RE-PHASES GENERATOR 10 of FIG. 1.
Figure 3:
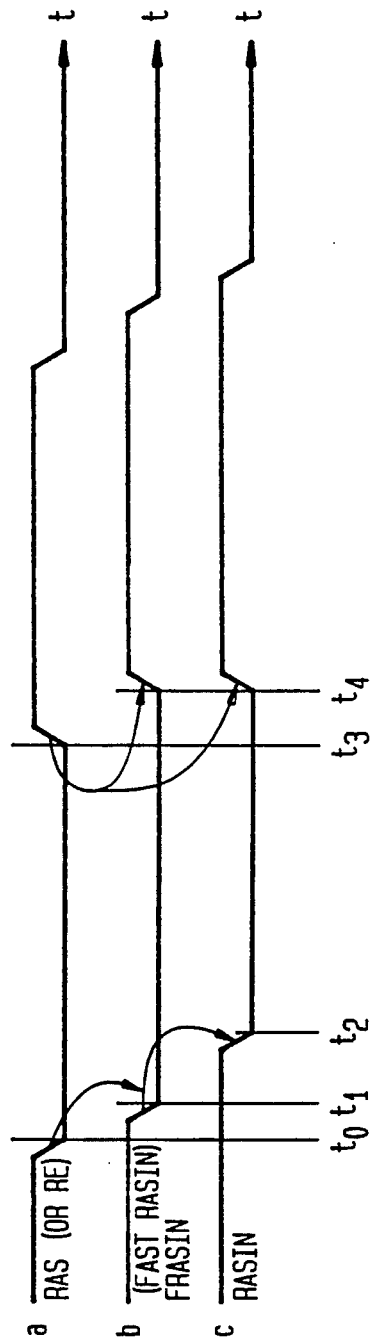
FIG. 3 is a diagram of electrical waveforms associated with the circuit of FIG. 2.

For all non-toggle mode operation the TOGGLE INPUT is high. For this condition, NOR gate 723 causes the output signal dB to be "low" and output signal d to be "high" forcing pass devices N402 and P402 to always be on and device N403 to always be off. When operated in the non-toggle mode, the RE Phases generator 100 functions like the prior art circuit of FIG. 2. Thus, the TOGGLE INPUT signal enables the memory system 9 to be operated either in accordance with the invention (when TOGGLE INPUT is low) or in accordance with the prior art (when TOGGLE INPUT is high).

The logic implementation illustrated in FIG. 7 is by way of example only and it should be evident that many different arrangements may be used to implement the invention. For example, the number and type of inverters and gates used to illustrate the invention may be changed to increase or decrease delays without departing from the inventive concept.

Figure 8:
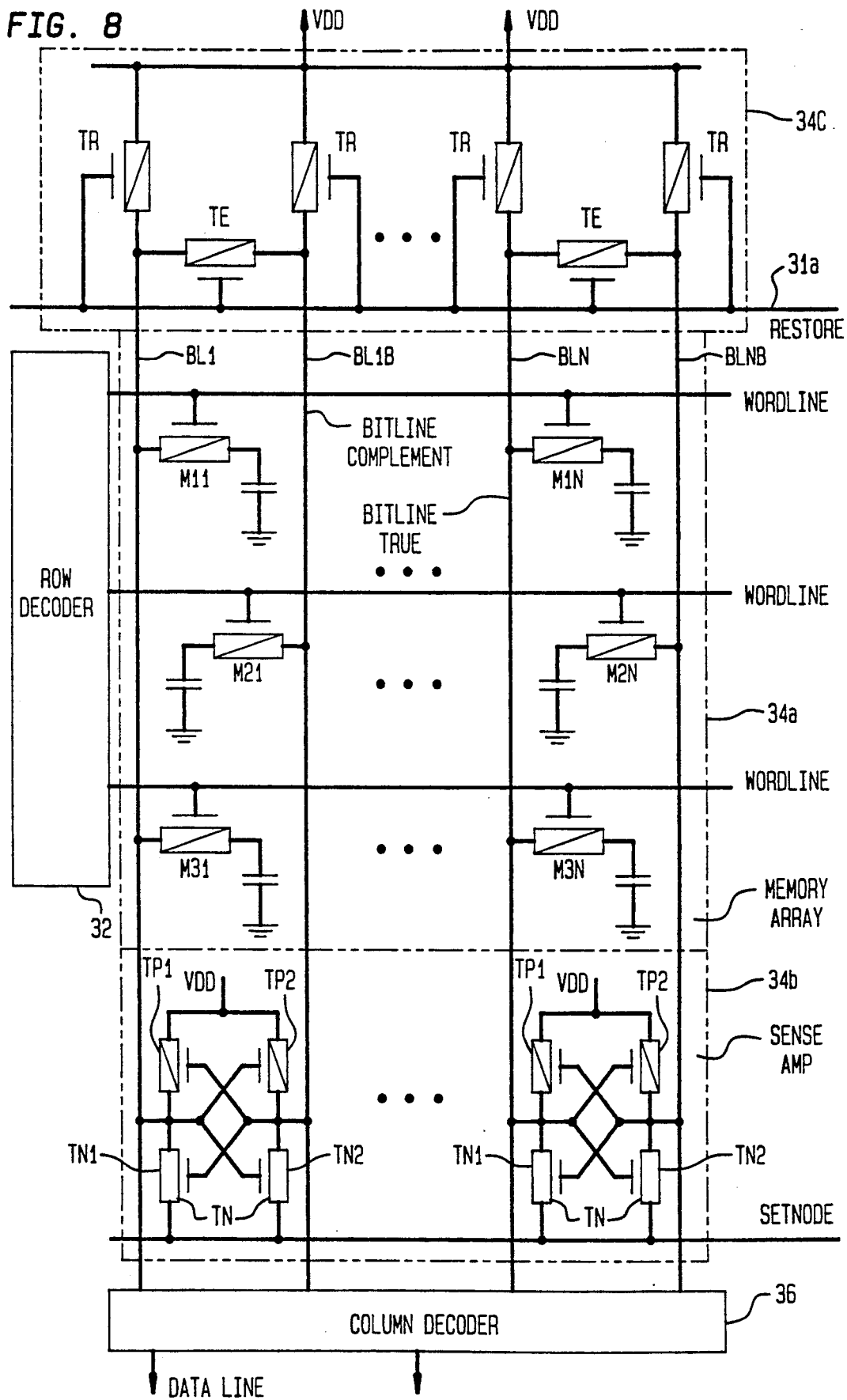
FIG. 8 is a semi-block, semi-schematic diagram of a memory array for use with the invention.

The memory array and sense amplifier 34 is shown in greater detail in FIG. 8. FIG. 8 shows a matrix array of memory elements in box 34a, the sense amplifiers in box 34b, and the restore and precharge circuitry in box 34c. Section 34a shows a matrix of memory elements arranged in rows and columns. There is one word line per row of memory elements and a pair of bit lines (BLj and BLjB) per column of elements. Each memory element comprises a single p-type transistor, identified as Mij, where i represents the row and j the column, having its conduction path connected between a bit line and one end of a storage capacitor whose other end is connected to ground.

Associated with each column is a sense amplifier comprised of two cross-coupled p-type transistors, identified as TP1 and TP2, and two cross-coupled n-type transistors identified as TN1 and TN2. The sources of the TP transistors are connected to Vdd which is a source of positive potential relative to ground and the sources of the TN transistors are connected to the SET NODE line. The drains of TP1 and TN1 and the gates of TP2 and TN2 are connected to one bit line (bit line true) and the drains of TP2 and TN2 and the gates of TP1 and TN1 are connected to the complementary bit line associated with the column.

The precharge and restore circuitry associated with each column includes, for each bit line, a p-type transistor, identified as TR, having its conduction path connected between Vdd and its bit line with its gate connected to the line 31a to which is applied the RESTORE signal. The TR transistors function to clamp their respective bit lines to Vdd when the RESTORE signal goes low. Connected between the two bit lines of each column is the conduction path of a p-type transistor identified as TE whose gate is connected to line 31a. The TE transistor is an equalization transistor which shorts the two bit lines of a column together during RESTORE (i.e., when the restore signal is low).

The rows are selected by means of row decoder 32 and the columns are selected by means of column decoder 36. The data lines connected to the column decoder are connected to the static register 22, as shown in FIG. 4.

Figure 9:
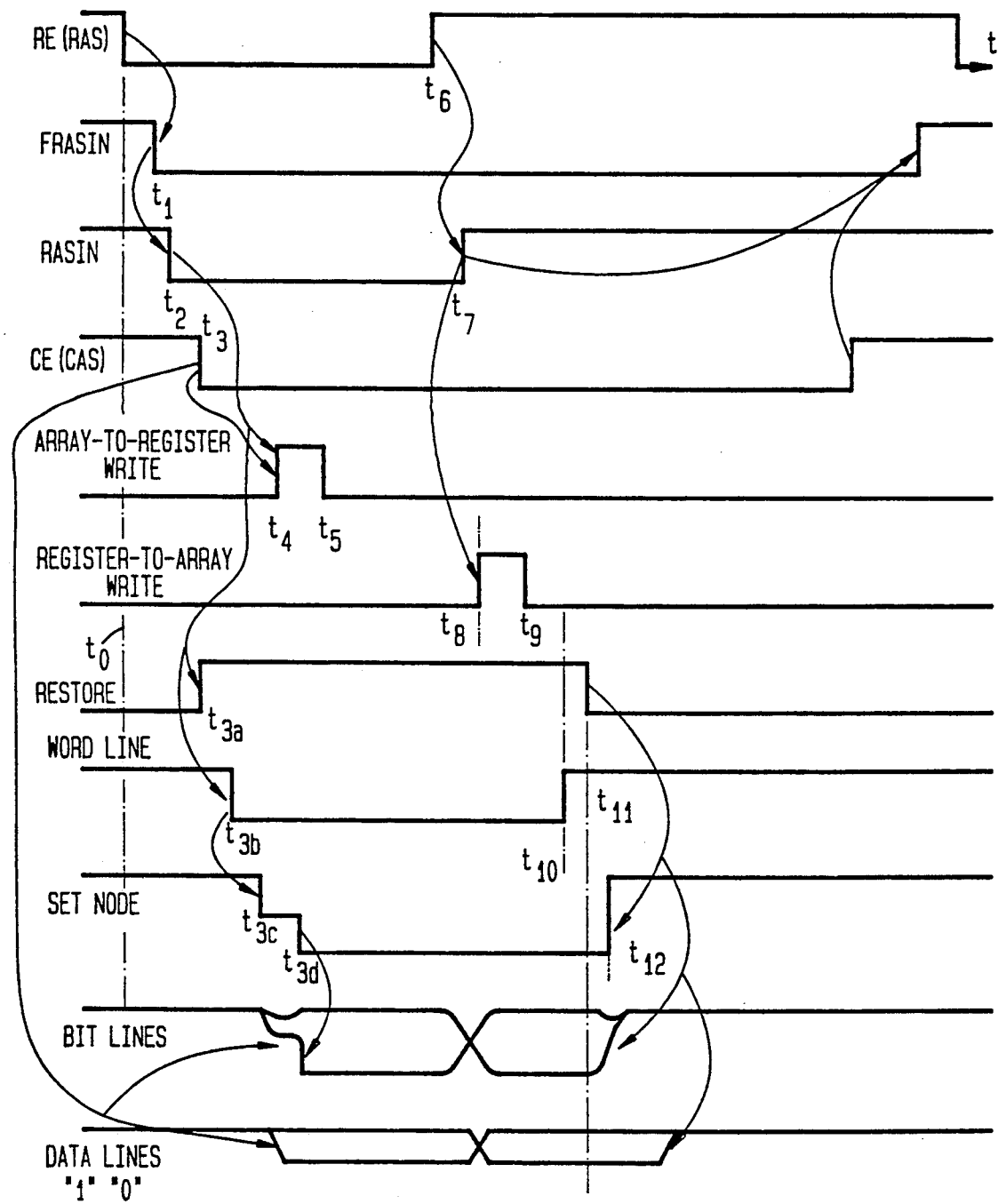
FIG. 9 is a diagram of electrical waveforms in memory systems embodying the invention.

Referring now to FIG. 9, a read cycle is initiated when the RE signal is enabled (goes low) at time t0. In response thereto, as discussed above, the FRASIN and the RASIN signals go low as shown at time t1 and t2, respectively, in FIG. 9. The FRASIN signal enables CE generator 12, control circuit 14 and buffers 16, while RASIN enables memory row and column control 28 and 30. When a word line address is decoded, the row decoder 32 enables a selected row and the contents stored by the elements of the selected row are transferred onto their respective bit lines. Concurrently, when an enabling CE signal is applied to generator 12 as shown at time t3 in FIG. 9, a CASIN signal (not shown) is generated enabling column control 30 (see FIG. 4) and activating column decoder 36 (see FIG. 4) whereby data on selected bit lines are coupled onto selected DATA LINES and via the DATA LINES into the static register 22. The actual writing of the information into the static register occurs between times t4 and t5 under the control of an array-to-register write signal generated by control circuit 30.

As shown in FIG. 9, with respect to the read-out from the array after RASIN is enabled, the RESTORE signal is driven high (disabled) at time t3a. Concurrently, a word line is enabled at time t3b and the information on the bit lines is amplified by means of the sense amplifiers. The SET NODE signal in FIG. 9 illustrates that the potential difference across the sense amplifier is gradually increased from a point at which the SET NODE potential is initially at or close to VDD until it is between VDD and ground (at time t3c) and then finally at or close to ground (at time t3d).

The information transferred into the static register 22 during times t4 to t5 over writes the data contained within the static register 22 with the data from the data lines which have just been read or loaded from the array. The t4 to t5 period during which data is transferred into the register 22 is a very short period of time, being just long enough to insure that the proper value is written into the register 22. After t5, the register 22 is disconnected from the array 34 until RE goes inactive (i.e., high).

Following RE going inactive, as shown at time t6 in FIG. 9, RASIN goes inactive (low to high) at time t7. RASIN going high causes column control 30 to produce a transient register-to-array write signal as shown for time t8 to t9 in FIG. 9. The register-to-array write signal causes data within the static register to be written onto the DATA LINES which in turn causes the data bits to be applied to the selected bit lines and then into selected cells. The register-to-array write signal does not affect the value of data contained within the static register 22. Rather, it forces a copy of the data in register 22 onto the DATA LINES for storing back to the array 34.

Readout from the static register 22 to the DATA I/O 24 can occur at the same time and independently from the array read of the register (register-to-array write). Again, the register-to-array write is non-destructive to the contents of the register 22, and so it can be seen that the contents of register 22 obtained during a given RE access remain within the register 22 until the next RE selection cycle produces another array-to-register write pulse. Following the RE going inactive (time t6) and RASIN going high (time t7) and the register-to-array write (time t8 to t9), the row decoder 32 is deselected (i.e., the word line goes high at time t10).

The bit lines and DATA LINES signals shown in FIG. 9 are shown to change values after RE goes high. This change in the data lines signals would occur due to the change in the data stored in static register 22 while RE was active low. Such a change could occur if, while RE was active low, a write cycle had occurred. Bear in mind that the register-to-array write and the transfer of data from the static register to the memory array is initiated by RE going high and RASIN going from low to high. This event occurs independently of the read out from the static register 22 to the DATA I/O and multiplexer 24.

In response to the RE and RASIN signals going high, the row control 28 produces a "low" RESTORE signal on line 31a which is coupled to array 34. At time t11 as shown in FIG. 9, the RESTORE signal goes low (i.e., restore condition) turning-on all the transistors TR and TE and driving the bit lines, the DATA LINES and the SET NODE of the array 34 to VDD volts. However, the data in register 22 is available even after RE becomes inactive and the array 34 is driven to the RESTORE and precharge condition. Thus, the system embodying the invention permits the contents of register 22 to continue to be read out. This is so, because the FRASIN signal is held in the enable state independent of RE or RASIN and thus allows the addresses and static register readout control to remain active during the RE restore phase. As discussed above and as shown in FIG. 9, the FAST RASIN which controls the address buffers 16, generator 12 and static register control 14 remains in the enabled condition so long as the CE signal is in the enable condition. Note that so long as the CE and CASIN signals are enabled, the control signals applied to static register 22 are enabled and the contents of the static register can continue to be read out. Since the address buffers 16 are enabled by FRASIN, changes in address may be used to select different locations of the register 22 for read-out. Thus, by generating a FRASIN signal which is a logically separate signal from RE but which goes active with RE and inactive only with RE and CE the system allows the address buffers and control circuitry to remain selected and to effectively read out data from the static register 22 during the RE precharge time without affecting array operation. In contrast to FRASIN, the RASIN signal follows the initiation and termination of the RE signal and continues to control all memory array 34 operation, and controls both the selection and de-selection of the memory array 34.

Note that only reads can occur during the time that RE is in inactivate (high) or in precharge. A data bit that is written would never make it to the array once RE is in the precharge (high) condition. All writes must still occur as they do for a conventional component, while RE is active.

It is to be appreciated and understood that the specific embodiments of the invention are merely illustrative of the general principles of the invention. Various modifications may be made by those skilled in the art which are consistent with the principles set forth. For example, the invention has been illustrated using a DRAM. However, it should be evident that many different types of memory arrays such as ROMS, EPROMS or even static RAMS could be used instead.

What is claimed is:

1. A memory system, which includes a random access memory array whose contents are selectively read out to a static register, the memory system comprising:
   means coupled to the memory array and within the static register for receiving and statically storing a predetermined number of data bits read out from the memory array upon the receipt of a read-out command; and
   enabling means coupled to the static register and to the memory array for enabling the read-out of the contents of the static register and for concurrently precharging the memory array to prepare the memory array for a subsequent read-out command.

2. The memory system of claim 1 wherein said random access memory array is a dynamic memory.

3. The memory system of claim 1 wherein the enabling means coupled to the static register and to the memory includes means for, during a read cycle, generating a first enabling signal for controlling the read period and the precharge period of the memory array and a second enabling signal for controlling the read-out period from the static register.

4. The memory system of claim 3 wherein the duration of the first enabling signal enables the read-out of data from the memory array for a preset period of time; and wherein the second enabling signal enables the read-out of data from the static register for a period of time which is longer than the preset period.

5. In combination:
   a memory array of data storage elements;
   a static register for statically storing selected bits read-out from the memory array into the static register; and
   signal generating means, which is responsive to a read-out command, coupled to the memory array and to the static register for:
   a) enabling the memory array and the read-out of selected data from the memory array into the static register for a time period which begins shortly after receipt of the read-out command and extends for a time TR thereafter;
   b) resetting the memory array after the time TR, and preparing it for the next read-out command during a subsequent time period TP which is sufficient to precharge the memory array and to prepare the memory array for a next read out; and
   c) enabling the contents of the static register to be read-out for a period of time which extends beyond the time TR and extends into the subsequent time period ,TP, during which the memory array is being prepared for the next read-out.

6. The combination of claim 5 wherein the signal generating means responsive to a read-out command includes means for producing first and second control signals; wherein the first control signal is coupled to the memory array and is in an enabling state for a time TR after receipt of a read command and is in a precharge condition for a time period of at least TP thereafter; and wherein the second control signal is set to a state in which it enables the static register for a period of time greater than TR but less than TR+TP.

7. The combination of claim 5 wherein said memory array is a dynamic random access memory.

8. The combination of claim 7 wherein said signal generating means responsive to a read command coupled to the memory array and to the static register includes means for:
   a) generating a first binary signal coupled to the memory array for, when in one binary state, enabling the read-out of the contents of said memory array onto said static register and for, when in the other binary state, resetting said memory array and causing it to be placed in a precharge condition; and
   b) generating a second binary signal for, when in one binary state, enabling the read-out of the contents of said static register and for, when in the other binary state, disabling the read-out of the contents of said static register.

9. The combination of claim 8 wherein said signal generating means includes means for initiating and terminating the generation of said first binary signal in response to the initiation and termination, respectively, of said read-out command and also includes means for initiating the generation of said second binary signal in response to the occurrence of said read-out command while selectively terminating said second binary signal upon termination of the read-out of the contents of said static register.

10. The combination of claim 9 wherein said signal generating means includes first and second buffers for generating said first and second signals and a control device coupled to said first and second buffers for controlling the period of said first and second signals.

11. A memory system including a memory array whose contents are selectively read out to a register, the memory system comprising:
   means responsive to a read-out command coupled to said memory array and to said register for enabling a predetermined number of data bits to be read out from said memory array and to be stored in said register; and
   said means including means coupled to said register and to said memory array for placing said memory in a precharge condition to prepare the memory array for the next read-out command following the transfer of said predetermined number of bits to said register; and, while precharging said memory array, enabling the continued read-out of the contents of said register for a selected period of time.

12. The memory system of claim 11 wherein said memory array is a dynamic random access memory.

13. The memory system of claim 11 wherein said register is a static register.

* * * * *